US006618304B2

(12) United States Patent
Duesman

(10) Patent No.: US 6,618,304 B2
(45) Date of Patent: Sep. 9, 2003

(54) MEMORY MODULE WITH TEST MODE

(75) Inventor: Kevin Duesman, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/036,772

(22) Filed: Dec. 21, 2001

(65) Prior Publication Data
US 2003/0117871 A1 Jun. 26, 2003

(51) Int. Cl.[7] .............................. G11C 7/00; G01R 31/28
(52) U.S. Cl. ........................ 365/201; 365/243; 365/175; 714/718
(58) Field of Search .................................. 365/201, 243, 365/230.03, 175; 714/718, 733; 324/73.1, 210

(56) References Cited

U.S. PATENT DOCUMENTS 5,675,545 A * 10/1997 Madhavan et al. ......... 365/201
5,796,746 A * 8/1998 Farnworth et al. .......... 714/718
5,828,824 A   10/1998 Swoboda
5,956,280 A    9/1999 Lawrence
6,133,745 A   10/2000 Yoon et al.

* cited by examiner

Primary Examiner—David Lam
(74) Attorney, Agent, or Firm—Leffert Jay & Polglaze, P.A.

(57) ABSTRACT

Embodiments of the present invention provide memory modules that mitigate the problems associated with using address pins on memory modules to supply super voltages to memory devices on the memory modules. In one embodiment, the memory module has a memory device that has a test pin. A pin of the memory module is connected to the test pin. The pin of the memory module connects the test pin to one of ground, a power source, or an open circuit when the memory module is inserted in a socket for operation. The pin of the memory module can be used to selectively supply a test voltage to the test pin when the memory module is not connected for operation.

27 Claims, 3 Drawing Sheets

MEMORY MODULE WITH TEST MODE

TECHNICAL FIELD

The present invention relates generally to the field of memory modules and, in particular, to providing super voltages to memory modules.

BACKGROUND

Voltages are often applied to a memory module, such as a single in-line memory module, a dual in-line memory module, or the like, to place a memory device of the module, such as dynamic random access memories (DRAMs), static random access memories (SRAMs), or the like, into a test mode. Moreover, such voltages are often used to blow one or more anti-fuses, for example, while a memory device is in a test mode. Blowing of one or more anti-fuses is commonly employed to provide a circuit path that bypasses a defective primary circuit element of a memory device, for example, as identified in a test mode, to replace the defective primary circuit element with a redundant circuit element. These voltages are typically greater than the normal operating voltages supplied to the memory module and are usually referred to as super voltages. Super voltages are applied the memory module when the memory module is not connected for use, e.g., not connected to a motherboard. For example, super voltages are often applied during a checkout phase of a manufacturing process for memory modules.

One method for supplying super voltages to several memory devices on a memory module involves using an address pin(s) on the memory module that is connected to an address pin on each of the memory devices. The address pins typically experience two voltage levels during operation, e.g., approximately zero and approximately two to five volts. These voltage levels are transmitted to the address pin on each memory device. When the memory module is not connected for use, the super voltage can be selectively applied to the address pin on the memory module, which transmits the super voltage to the address pin on each memory device to place the respective memory devices into a test mode and/or to blow one or more anti-fuses. A chip-select signal can be used to select one of the memory devices to be tested.

One problem with using an address pin on a memory module to supply super voltages to a memory device is that voltage threshold circuitry usually needs to be added to the address pin on the memory. The added circuitry increases the complexity and thus the cost of the memory. Another problem is that noise on the address pin of the memory module during operation may increase the risk of accidentally placing the memory devices into the test mode, thus removing the memory devices from normal operation.

For the reasons stated above, and for other reasons stated below which will become apparent to those skilled in the art upon reading and understanding the present specification, there is a need in the art for memory modules that provide alternatives to using address pins on the memory modules to trigger test modes of memory devices on the memory modules.

SUMMARY

The above-mentioned problems with using address pins on memory modules to supply super voltages to memory devices on the memory modules and other problems are addressed by embodiments of the present invention and will be understood by reading and studying the following specification. Embodiments of the present invention provide memory modules that provide alternatives to using address pins on memory modules to supply super voltages to memory devices on the memory modules. These embodiments mitigate the problems associated with using address pins on memory modules to supply super voltages to memory devices on the memory modules.

More particularly, in one embodiment, a memory module is provided. The memory module has a memory device that has a test pin. A pin of the memory module is connected to the test pin. The pin of the memory module connects the test pin to one of ground, a power source, or an open circuit when the memory module is connected for operation. The pin of the memory module selectively supplies a super voltage to the test pin when the memory module is not connected for operation.

In another embodiment, a memory module is provided that has a memory device having a test pin, a resistor-capacitor circuit connected to the test pin, a buffer connected to the resistor-capacitor circuit, and a diode connected to the test pin and to the resistor-capacitor circuit. A pin of the memory module is connected to the diode. The pin of the memory module connects the test pin to one of ground, a power source, or an open circuit when the memory module is connected for operation. The buffer selectively transmits first and second signals to the test pin via the resistor-capacitor circuit when the memory module is connected for operation. When the memory module is not connected for operation, the pin of the memory module selectively supplies a super voltage to the test pin via the diode.

Other embodiments are described and claimed.

DETAILED DESCRIPTION

In the following detailed description, reference is made to the accompanying drawings that form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

Figure 1:
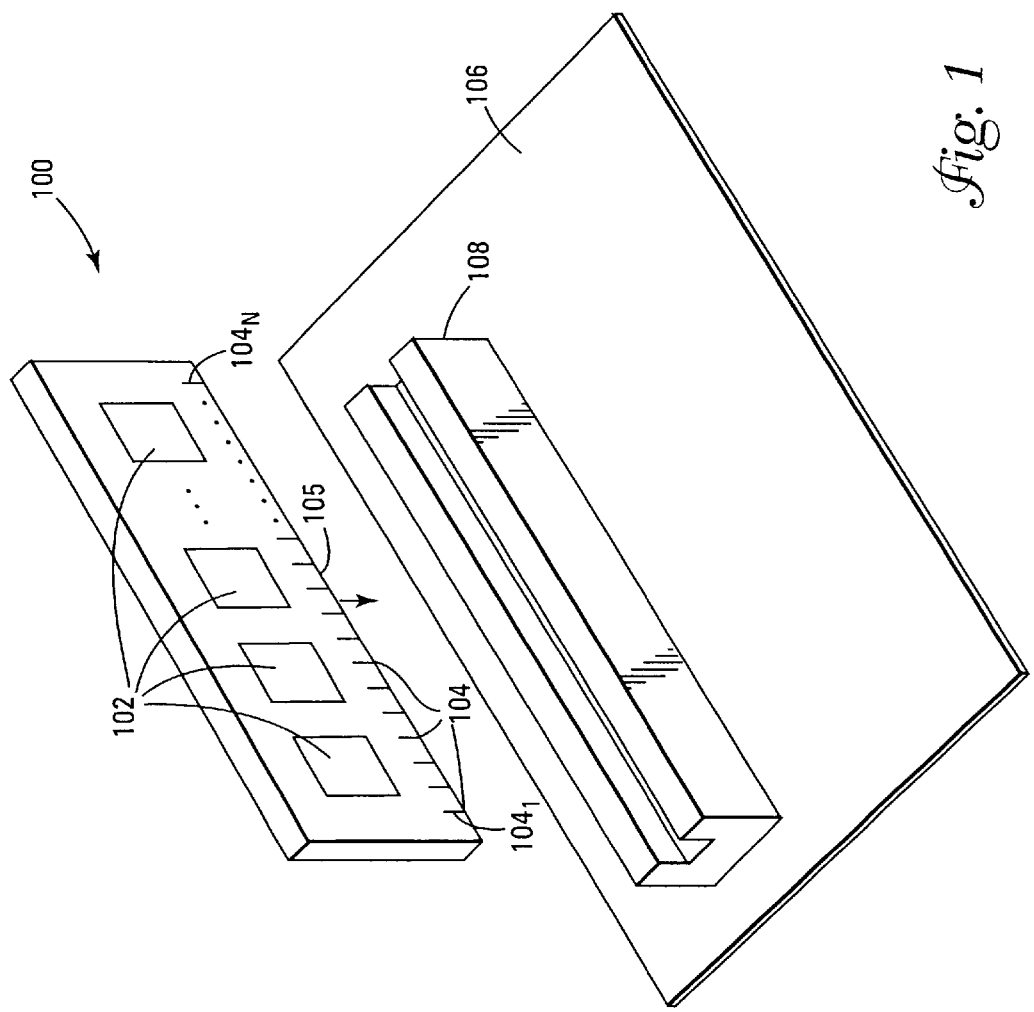
FIG. 1 is an exploded view of an embodiment of a memory module and a circuit board according to the teachings of the present invention.

FIG. 1 illustrates an embodiment of a memory module 100 according to the teachings of the present invention. Memory module 100 includes a number of memory devices 102, such as dynamic random access memories (DRAMs), static random access memories (SRAMs), or the like. In one embodiment, memory module 100 is a single in-line memory module, a dual in-line memory module, or the like. Memory module 100 includes pins (or electrical contacts) 104, e.g., pins $104_1$ to $104_N$ defining an edge connector 105.

Pins 104 electrically connect memory devices 102 to a circuit board 106, e.g., a motherboard, when edge connector 105 is inserted into a socket 108, e.g., single in-line memory module socket, a dual in-line memory module socket, or the like. The term "pin" should not be limited to a specific physical design, but is intended to represent any electrical interconnection.

Figure 2:
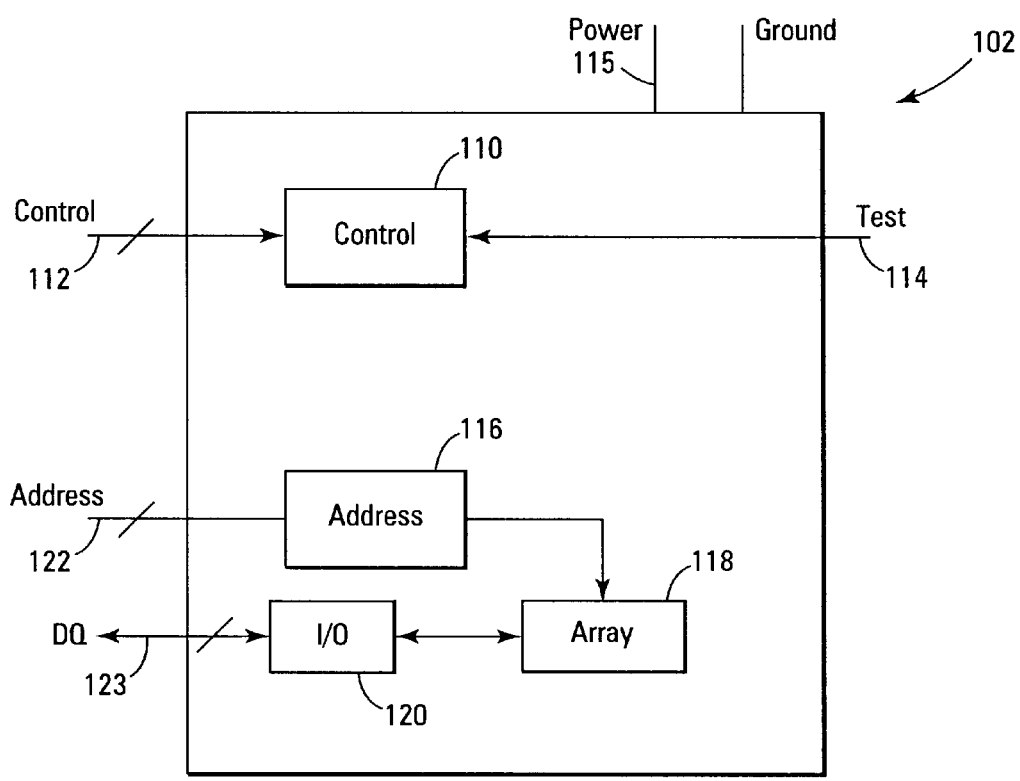
FIG. 2 is a block diagram of an embodiment of a memory device according to the teachings of the present invention.

FIG. 2 is a block diagram of an embodiment of a representative memory device 102. Memory device 102 is adapted to operate in two modes: a normal operating mode when memory module 100 is connected to circuit board 106 and a test mode when memory module 100 is not connected to circuit board 106. Memory device 102 includes a control 110 that controls the operation of memory device 102. Control 110 receives control signals from circuit board 106 via control pins 112 connected to pins 104. Control 110, in one embodiment, is also connected to a test pin 114 that is connected to one of pins 104. In another embodiment, test pin 112 is connected to a power pin 115, as explained below. Memory device 102 includes an address circuit 116 connected to a memory-cell array 118. Array 118 is connected to an input/output circuit 120. Address circuit 116 receives address signals from circuit board 106 via address pins 122 connected to pins 104. Input/output circuit 120 respectively transmits and receives data to and from circuit board 106 via DQ pins 123 connected to pins 104.

Figure 3:
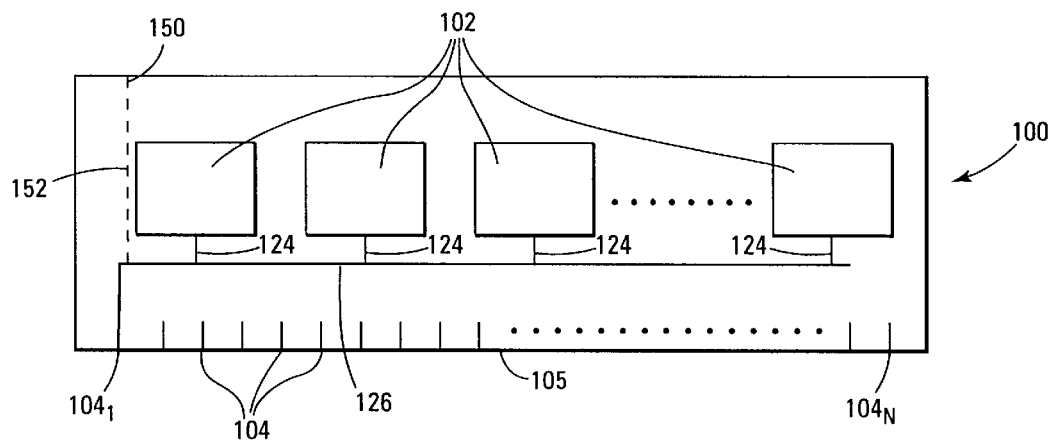
FIG. 3 illustrates one embodiment of the memory module of FIG. 1.

In one embodiment of memory module 100, one of pins 104, e.g., pin $104_1$, is connected to each of memory devices 102, as shown in FIG. 3, via lines 124 and line 126. In one embodiment, lines 124 and line 126 are conductive traces disposed on memory module 100. Each of lines 124 is connected to test pin 114 and therefore pin $104_1$ is connected to test pin 114 of each of memory devices 102. When memory module 100 is connected to circuit board 106 for operation, pin $104_1$ is connected to ground (e.g., pin $104_1$ is a ground pin). In other embodiments, pin $104_1$ is connected to a power source on circuit board 106 (e.g., pin $104_1$ is a power pin) or is connected to an open circuit (e.g., pin $104_1$ is a no-connect pin). That is, the electrical interconnect is selected to match a Vcc, ground, or NC connection of socket 108.

Pin $104_1$ is used to supply super voltages, e.g., approximately 50 to 100 percent greater than Vcc, to test pin 114 when memory module 100 is not connected to circuit board 106 and is, for example, being tested. The super voltage, in one embodiment, places memory modules 102 into a test mode. In another embodiment, the super voltage is used to blow one or more anti-fuses in each of memory devices 102. In yet another embodiment, the super voltage is used to blow one or more anti-fuses in each of memory devices 102 during a test mode.

When using a ground, power, or no-connect pin, e.g., pin $104_1$, to supply super voltages, there is no need to add circuitry to the ground, power, or no-connect pin of the type that would typically be added to an address pin for using the address pin to supply super voltages. Moreover, when memory module 100 is connected to circuit board 106 for operation and pin $104_1$ is either a ground or no-connect pin, there is no voltage supplied to test pin 114 and thus there is little risk that memory devices 102 could be inadvertently placed into a test mode during normal operation. When pin $104_1$ is a power pin, pin $104_1$ receives a voltage while memory module is connected to circuit board 106. However, this voltage is below the super voltage and noise levels are usually relatively low. Therefore, the risk of the voltage on pin $104_1$ being increased to a level sufficient to place memory modules 102 into a test mode during normal operation due to noise on pin $104_1$ is substantially less than the risk associated with noise on an address pin increasing the voltage to a level sufficient to place memory modules 102 into a test mode during normal operation.

In one embodiment, a test interconnect pin 150 is connected to each of memory devices 102, as shown by dashed line 152 in FIG. 3, and thus to test pin 114 of each of memory devices 102. Test interconnect pin 150 is used to supply super voltages to test pin 114 when memory module 100 is not connected to circuit board 106.

Figure 4:
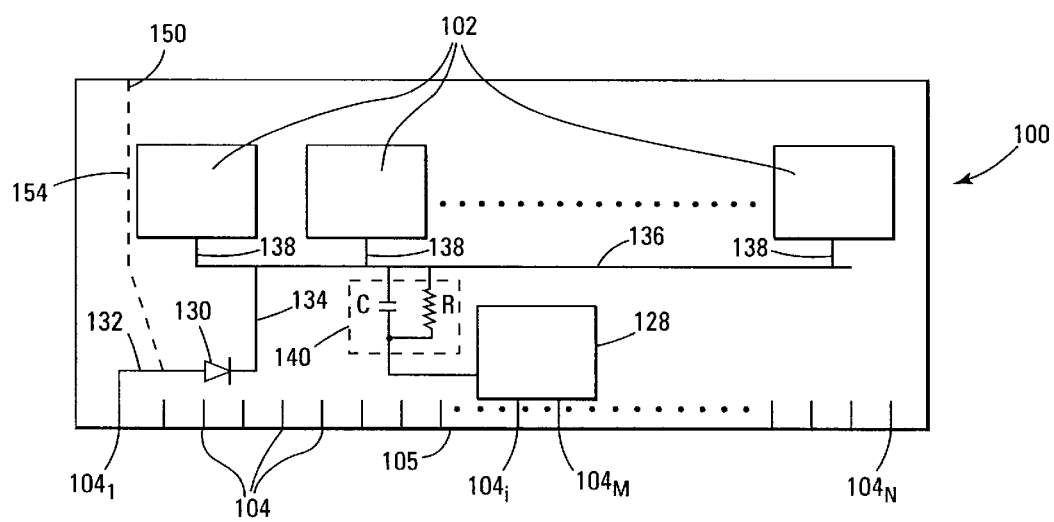
FIG. 4 illustrates another embodiment of the memory module of FIG. 1.

FIG. 4 depicts an embodiment of circuit board 100 that includes at least one buffer 128 connected to pins $104_i$ to $104_M$. Pin $104_1$ is connected to an anode of a diode 130 by a line 132. A cathode of diode 130 is connected to each of memory devices 102, as shown in FIG. 4, via line 134, line 136, and lines 138. In one embodiment, line 132, line 134, line 136, and lines 138 are conductive traces disposed on memory module 100. A resistor-capacitor (RC) circuit 140 is connected between buffer 128 and each of memory devices 102 via line 136 and lines 138. Each of lines 138 is connected to test pin 114 of each of memory devices 102 and therefore pin $104_1$, diode 130, buffer 128, and RC circuit 140 are connected to test pin 114 of each of memory devices 102. In one embodiment, test pin 114 is connected to address device 116 of each of memory devices 102. In one embodiment, test pin 114 receives three input voltage levels: approximately zero volts (a digital zero), approximately two to five volts (a digital one), and a super voltage. These voltages are subsequently transmitted to control 110, power pin 115, or address device 116.

When memory module 100 is connected to circuit board 106, pin $104_1$ is connected to ground. Buffer 128 receives input signals from circuit board 106 via pins $104_i$ to $104_M$, amplifies these signals, and transmits the amplified signals to control pin 112 or address pins 122 of each of memory devices 102 via RC circuit 140, line 138 and lines 136 when memory module 100 is connected to circuit board 106. In one embodiment, buffer 128 transmits approximately zero volts upon receiving an input less than approximately one to two volts and approximately three to five volts upon receiving an input greater than approximately one to two volts. Diode 130 prevents these signals from going to pin $104_1$ and thus to ground. In other embodiments, buffer 128 is a registered buffer, and buffer 128 transmits approximately zero volts upon receiving a control signal when the input signal less than approximately one to two volts. Buffer 128 transmits approximately three to five volts upon receiving a control signal when the input signal greater than approximately one to two volts.

Pin $104_1$ supplies a super voltage to test pin 114 when memory module 100 is not connected to circuit board 106. RC circuit protects buffer 128 from the super voltage. The super voltage, in one embodiment, places memory modules 102 into a test mode. In another embodiment, the super voltage is used to blow one or more anti-fuses in one or more of memory devices 102 while the memory devices are in the test mode. When module 100 is inserted in socket 108, the electrical interconnect, and thus the diode, is coupled to a designated ground connection. This embodiment allows test pin 114 to operate as a dual purpose interconnect, such as an address or data connection.

In one embodiment, a test interconnect pin 150 is connected to diode 130, as shown by dashed line 154 in FIG. 4, and thus to test pin 114 of each of memory devices 102. Test interconnect pin 150 is used to supply super voltages to test pin 114 when memory module 100 is not connected to circuit board 106.

CONCLUSION

Embodiments of the present invention have been described. The embodiments provide memory modules that use a ground, no-connect, or power pin of a socket as an alternative to using address pins on memory modules to supply super voltages to memory devices on the memory modules. Using a ground, no-connect, or power pin to supply a super voltage to memory devices on the memory modules mitigates the problems associated with using address pins on memory modules to supply super voltages.

The present invention has been described as having a test pin on each memory device. It will be appreciated that a dedicated pin is not necessary, but can have multiple functions. By connecting the test pin(s) to a location on the memory module that is designated as ground, Vcc, or NC, the accidental triggering of a test mode is reduced when the memory module is connected to a motherboard.

Although specific embodiments have been illustrated and described in this specification, it will be appreciated by those of ordinary skill in the art that any arrangement that is calculated to achieve the same purpose may be substituted for the specific embodiment shown. This application is intended to cover any adaptations or variations of the present invention. For example, the embodiments illustrated in FIGS. 3 and 4 can coexist on a single memory module 100. Moreover, the location of test interconnect pin 150 is not limited to the edge of memory module 100, as shown in FIGS. 3 and 4. Rather, test interconnect pin 150 can be located at any location on memory module 100 that is remote to edge connector 105.

What is claimed is:

1. A memory module comprising:
   a memory device having a test pin;
   a second pin connected to the test pin, the second pin connecting the test pin to one of ground, a power source, or an open circuit when the memory module is connected for operation, the second pin for selectively supplying a test voltage to the test pin when the memory module is not connected for operation; and
   a diode connected between the second pin and the test pin.

2. The memory module of claim 1, wherein the test voltage is used to place the memory device into a test mode.

3. The memory module of claim 1, wherein the test voltage is used to program at least one anti-fuse within the memory device.

4. The memory module of claim 1, wherein the test pin is connected to one of an address connection or a control connection of the memory device.

5. The memory module of claim 1, further comprising a plurality of memory devices.

6. The memory module of claim 1, further comprising a buffer connected to the test pin.

7. A memory module comprising:
   a memory device having a test pin;
   a second pin connected to the test pin, the second pin connecting the test pin to one of ground, a power source, or an open circuit when the memory module is connected for operation, the second pin for selectively supplying a test voltage to the test pin when the memory module is not connected for operation;
   a buffer connected to the test pin; and
   a resistor-capacitor circuit connected between the buffer and the test pin.

8. A memory module comprising:
   a memory device having a test pin;
   a resistor-capacitor circuit connected to the test pin;
   a buffer connected to the resistor-capacitor circuit;
   a diode, a cathode of the diode connected to the test pin and to the resistor-capacitor circuit; and
   a second pin connected to the diode at an anode of the diode, the second pin connecting the test pin to ground when the memory module is connected for operation, wherein the buffer selectively transmits signals to the second pin via the resistor-capacitor circuit when the memory module is connected for operation, the second pin for selectively supplying a test voltage to the test pin via the diode when the memory module is not connected for operation.

9. The memory module of claim 8, wherein a first voltage signal is transmitted by the buffer when a signal at an input of the buffer is at a first voltage level and a second voltage signal is transmitted by the buffer when the signal at an input of the buffer is at a second voltage level.

10. The memory module of claim 8, wherein the test pin is connected to one of an address connection or a control connection of the memory device.

11. The memory module of claim 8, where in a first voltage signal is transmitted by the buffer when a signal at an input of the buffer is at a first voltage level and the buffer receives a control signal, and a second voltage signal is transmitted by the buffer when the signal at an input of the buffer is at a second voltage level and the buffer receives a control signal.

12. A method for supplying a test voltage to a memory device on a memory module, the method comprising:
   electrically connecting a test pin of the memory device to a pin of the memory module, the pin of the memory module is connected to one of ground, a power source, or an open circuit when the memory module is inserted into a socket for operation;
   supplying the test voltage to the pin of the memory module when the module is not connected for operation; and
   preventing signals from reaching the pin of the memory module that are selectively transmitted from a buffer of the memory module to the test pin of the memory device when the memory module is connected for operation;
   wherein preventing signals from reaching the pin of the memory module comprises using a diode.

13. A method for supplying a test voltage to a memory device on a memory module, the method comprising:
   electrically connecting a test pin of the memory device to a pin of the memory module, the pin of the memory module is connected to one of ground, a power source, or an open circuit when the memory module is inserted into a socket for operation;
   supplying the test voltage to the pin of the memory module when the module is not connected for operation; and
   protecting a buffer of the memory module from the test voltage while the test voltage is supplied to the pin of the memory module.

14. The method of claim 13, wherein protecting the buffer of the memory module from the test voltage comprises using a resistor-capacitor circuit.

15. The method of claim 13, wherein electrically connecting the test pin of the memory device to the pin of the memory module comprises connecting the test pin of each of a plurality of memory devices to the pin of the memory module.

16. The method of claim 13, further comprising placing the memory device into a test mode using the test voltage.

17. The method of claim 13, further comprising programming at least one anti-fuse within the memory device in response to the test voltage.

18. The method of claim 13, further comprising preventing signals from reaching the pin of the memory module that are selectively transmitted from a buffer of the memory module to the test pin when the memory module is connected for operation.

19. A method for supplying a test voltage to a memory device on a memory module, the method comprising:

connecting a test pin of the memory device to a pin of the memory module, the pin of the memory module is connected to ground when the memory module is inserted into a socket for operation;

preventing signals from reaching the pin of the memory module that are selectively transmitted from a buffer of the memory module to the test pin of the memory device when the memory module is connected for operation;

supplying the test voltage to the pin of the memory module when the module is not connected for operation; and protecting the buffer of the memory module from the test voltage;

wherein preventing signals from reaching the pin of the memory module comprises using a diode.

20. A method for supplying a test voltage to a memory device on a memory module, the method comprising:

connecting a test pin of the memory device to a pin of the memory module, the pin of the memory module is connected to ground when the memory module is inserted into a socket for operation;

preventing signals from reaching the pin of the memory module that are selectively transmitted from a buffer of the memory module to the test pin of the memory device when the memory module is connected for operation;

supplying the test voltage to the pin of the memory module when the module is not connected for operation; and protecting the buffer of the memory module from the test voltage;

wherein protecting the buffer of the memory module from the test voltage comprises using a resistor-capacitor circuit.

21. A memory module comprising:

a memory device having a test pin;

a test interconnect pin connected to the test pin for selectively supplying a test voltage to the test pin when the memory module is not connected for operation; and a diode connected between the test interconnect pin and the test pin.

22. The memory module of claim 21, further comprising a resistor-capacitor circuit connected between the buffer and the test pin.

23. The memory module of claim 21, wherein the test voltage is used to place the memory device into a test mode.

24. The memory module of claim 21, wherein the test voltage is used to program at least one anti-fuse within the memory device.

25. The memory module of claim 21, further comprising a plurality of memory devices.

26. The memory module of claim 21, wherein the test interconnect pin is disposed on the memory module remote to an edge connector of the memory module.

27. The memory module of claim 21, further comprising a buffer connected to the test pin.

* * * * *